Jan. 31, 1950 F. MURAL 2,496,063

AUTOMATIC TUNING CIRCUIT FOR RADIO RECEIVERS

Filed July 23, 1948

INVENTOR
Frank Mural
BY Philip S. Hooper
ATTORNEY

Patented Jan. 31, 1950 2,496,063

UNITED STATES PATENT OFFICE 2,496,063

AUTOMATIC TUNING CIRCUIT FOR RADIO RECEIVERS

Frank Mural, New York, N. Y., assignor to Radio Corporation of America, a corporation of Delaware Application July 23, 1948, Serial No. 40,263

17 Claims. (Cl. 250—40)

This invention relates generally to automatic tuning control of radio receivers and particularly to a method of and circuit for restricting or limiting the automatic tuning range of the receiver.

The desirability of providing an automatic frequency control circuit (AFC circuit) for a broadcast receiver has long been recognized. Normally, it is not too difficult to tune a receiver for receiving amplitude modulated waves (AM waves). This is usually done by adjusting the tuning control of the receiver until the received signal is reproduced with maximum volume, which is also the point of minimum distortion. However, it is very difficult to tune a receiver receiving frequency modulated waves (FM waves) to minimum distortion. The discriminator characteristic of any frequency discriminator including the ratio detector is such that an FM wave may be received on three distinct tuning positions, only one of which will reproduce the FM wave with minimum distortion. Furthermore, the exact tuning position where the distortion of the demodulated signal is a minimum does not correspond to the point of maximum volume in an FM receiver.

It is therefore very important to provide a superheterodyne receiver and particularly an FM receiver with an AFC circuit to provide automatic tuning. The AFC circuit will also correct for the frequency drift of the local oscillator which is particularly difficult to control at the high frequency range allocated for FM broadcasting purposes. However, AFC circuits have not been widely used in radio receivers because they have a tendency to drag, that is, the automatic frequency control will continue to hold the receiver in tune with a previously selected station even when the manual tuning control of the receiver is turned to tune in another station, that is, when the receiver is detuned. Accordingly, within the frequency range before the AFC voltage releases the local oscillator, other stations and particularly weak stations may be masked by the action of the AFC circuit. In order to overcome this disadvantage of AFC circuits, it would be desirable to limit the range of effectiveness of the automatic frequency control system so that it would be deactivated quickly when the receiver is manually detuned to receive a different station.

It is an object of the present invention therefore to provide, in a receiver having an AFC circuit, a novel method of and circuit for automatically deactivating the AFC circuit when the detuning of the receiver exceeds a predetermined amount.

A further object of the invention is to provide an AFC circuit for a radio receiver including novel circuit means for preventing the automatic frequency control from dragging or masking weak stations.

Another object of the invention is to provide, in a receiver having an AFC circuit, simple and inexpensive electronic circuit means for limiting the range of effectiveness of the automatic frequency control system.

A broadcast receiver conventionally comprises a signal wave transmission channel which is manually tunable over a predetermined frequency range. The manual tuning of the receiver may be effected by rotating a tuning control knob, by activating a push button or by a manually started motor control. The receiver may further comprise an AFC circuit including a frequency discriminator which may be of the ratio detector type. A conventional ratio detector has been described, for example, in an article by S. W. Seeley which appeared in RCA Review of June 1947 and in another article published in FM and Television of December 1947 on page 26. A filter circuit coupled to the discriminator will develop an AFC voltage of a polarity and magnitude representative of the frequency deviation of the mean frequency of the selected wave from the assigned center frequency of the discriminator. This AFC signal is of zero magnitude when the receiver is correctly tuned. The AFC circuit is utilized for automatically reducing the mistuning of the receiver.

In accordance with the present invention, the AFC circuit is automatically deactivated when the receiver is detuned to select another station. To this end there is developed from the ratio detector a deactivation signal having a magnitude representative of the degree of detuning of the receiver. Preferably, the deactivation signal consists of two voltages of opposite polarity. These voltages each have a maximum value when the receiver is correctly tuned. The AFC signal is reduced to an inoperative value when the relative magnitudes of the AFC signal and one of the deactivation voltages reach a predetermined value. This is preferably the condition when the two are of substantially equal magnitude. Thus, the two signals may be compared by a pair of rectifiers, one of which becomes conducting when the magnitude of the AFC signal reaches that of the deactivation signal.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figures 1, 2, 3, 4:
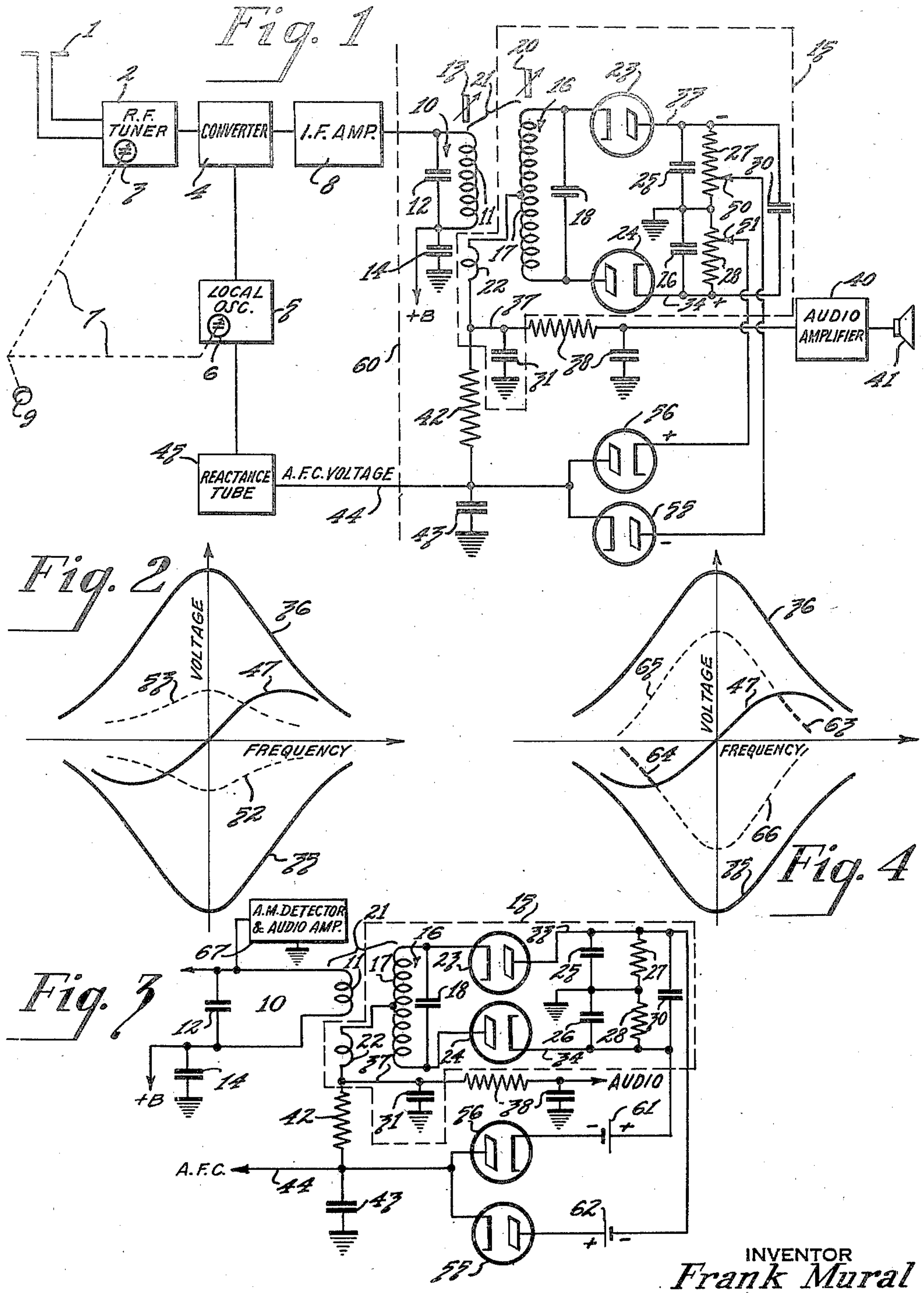
Fig. 1 is a circuit diagram of a preferred embodiment of the automatic tuning circuit of the present invention.
Fig. 2 is a graph illustrating voltages derived from different points of the circuit of Fig. 1.
Fig. 3 is a circuit diagram of a modified tuning control circuit in accordance with the invention.
Fig. 4 is a graph illustrating voltages derived from different points of the circuit of Fig. 3.

Referring now to Fig. 1 there is illustrated a superheterodyne FM receiver embodying an automatic tuning circuit in accordance with the present invention. The FM wave may be intercepted by an antenna such as dipole 1 and impressed upon a suitable signal selector such as radio frequency tuner 2 which may include a radio frequency amplifier. Tuner 2 includes a variable reactance such as variable capacitor 3 for tuning the receiver over a predetermined frequency range. The selected FM wave is converted to an intermediate frequency wave by frequency converter 4 to which is connected local oscillator 5. Oscillator 5 is tunable over a predetermined frequency range by a variable reactance such as variable capacitor 6. Preferably, capacitors 3 and 6 are ganged together for unicontrol as shown by dotted line 7 in order to select broadly an FM wave by actuating tuning control knob 9. The intermediate frequency signal derived from converter 4 is further amplified by intermediate frequency amplifier 8.

Intermediate frequency amplifier 8 has an output circuit 10 tuned to the intermediate frequency and including coil 11 shunted by capacitor 12. The resonant frequency of circuit 10 may be adjusted by paramagnetic core 13. The low alternating potential terminal of output circuit 10 is connected to a suitable source of positive voltage indicated at +B which may be bypassed for intermediate frequency currents by bypass capacitor 14.

Ratio detector 15 is coupled to output circuit 10 by a frequency discriminator network which comprises tuned circuit 16 including coil 17 shunted by capacitor 18. Circuit 16 is tuned to the intermediate frequency and its frequency may be adjusted by paramagnetic core 20. Coils 11 and 17 are magnetically coupled as indicated at 21. Tertiary winding 22 is tightly coupled to coil 11 and has one terminal connected to the midpoint of coil 17. Coil 17 preferably consists of a bifilar winding so that movement of core 20 will not unbalance the coil. Two rectifiers such as diodes 23 and 24 are connected in opposed relationship to the discriminator network. Thus, the cathode of diode 23 is connected to the upper terminal of tuned circuit 16 while the lower terminal of the tuned circuit is connected to the anode of diode 24.

The ratio detector 15 has an output circuit including load capacitors 25, 26 connected in series between the anode of diode 23 and the cathode of diode 24. A pair of resistors 27 and 28 bypasses load capacitors 25, 26, and the junction points of capacitors 25, 26 and of resistors 27, 28 are grounded as shown. Stabilizing capacitor 30 is connected across resistors 27, 28. The other terminal of tertiary winding 22 is bypassed to ground for intermediate frequency currents by bypass capacitor 31 so that tertiary winding 22 is effectively connected between the midpoint of coil 17 and the grounded junction points of load capacitor 25, 26 and resistors 27, 28.

Ratio detector 15 is of conventional design. The resistance of resistors 27, 28 and the capacitance of stabilizing capacitor 30 are such that the time constant of this circuit is of the order of 0.3 second. Accordingly, the voltages at point 33, which is a junction point between resistor 27 and diode 24 are maintained constant for short time variations of the order of a cycle of the modulation frequency The voltages developed at points 33 and 34 in dependance upon variations in input frequency are shown at 35 and 36 in Fig. 2. These voltages are of opposite polarity and have maximum amplitudes when the frequency deviation of the mean frequency of the selected wave from the assigned center frequency of the ratio detector becomes zero. When this frequency deviation is not zero, the voltages represented by curves 35 and 36 decrease as illustrated in Fig. 2.

The demodulated signal which may be an audio signal, may be derived from lead 37 connected to tertiary winding 22. The audio signal is representative of the instantaneous frequency deviation of the FM carrier wave from its center frequency. The relative magnitudes of the currents through diodes 23, 24 depend on the instantaneous frequency deviation of the carrier wave and therefore, the voltage at the tap of coil 17 will vary with respect to ground at a rate representative of the audio signal. The audio signal may be passed through a de-emphasis filter 38 in accordance with conventional practice and may then be amplified by audio amplifier 40 and reproduced by loud speaker 41.

When the audio frequency component is removed from the signal derived from lead 37, an AFC signal may be obtained. To this end there is provided a modulation-frequency filter including series resistor 42 connected to output lead 37 and bypass capacitor 43. Series resistor 42 has a resistance which is considerably larger than that of resistor 27, 28 for a purpose to be explained hereinafter. The time constant of filter circuit 42, 43 is of the order of 0.1 second. The thus obtained AFC signal or voltage may be derived from lead 44 and impressed upon reactance tube 45 which is coupled to oscillator 5 to control its frequency. The AFC circuit described thus tends to reduce the mistuning of the receiver in accordance with conventional practice. It is to be understood that the frequency of oscillator 5 may also be controlled by a variable resistance tube instead of a reactance tube. Such a resistance tube may be used for controlling the frequency of an RC oscillator.

The AFC signal derived from lead 44 is illustrated in Fig. 2 at 47. Curve 47 resembles the dynamic frequency characteristic of a discriminator and represents the mean frequency deviation of the center frequency of a selected wave from the assigned center frequency of ratio detector 15. It will be observed that AFC signal 47 becomes zero when the receiver is at resonance with the selected wave. When the mean frequency of the selected FM wave is above the assigned center frequency of ratio detector 15, AFC signal 47 will become positive, and when the receiver is mistuned in the opposite direction AFC signal 47 becomes negative. Curve 47 extends over a frequency range which is appreciably wider than the side bands of an FM wave. Accordingly, the AFC control has a tendency to drag, that is, it will continue to tune the receiver automatically to a previously selected station even after tuning control knob 9 is rotated to tune in another station.

In accordance with the present invention, AFC signal 47 is reduced to an inoperative value when the detuning of the receiver exceeds a predetermined value. Thus, the automatic tuning range of the receiver is limited or the effectiveness of the AFC circuit is restricted to a predetermined frequency range. For this purpose, a deactivation signal is derived from the output circuit of ratio detector 15. The deactivation signal consists of two voltages of opposite polarity such as the voltages developed on points 33 and 34 of ratio detector 15. By means of taps 50 and 51 on resistors 27, 28 a portion of each of the two unidirectional voltages developed on points 33, 34 may be derived. Dotted curves 52 and 53 of Fig. 2 illustrate the voltages derived from taps 50, 51 in dependence on the mean frequency of the received carrier wave. Curves 52 and 53 generally resemble curves 35, 36 but are of smaller magnitude.

The magnitudes of the voltages represented by curves 52, 53 are now compared to the magnitude of the AFC signal represented by curve 47. In accordance with the present invention, this is accomplished by providing diode rectifiers 55 and 56 connected in opposed relationship. Furthermore, diodes 55, 56 are connected back to back with diodes 23, 24 of ratio detector 15. Thus, tap 50 is connected to the anode of diode 55 while tap 51 is connected to the cathode of diode 56. The cathode of diode 55 and the anode of diode 56 are connected together to lead 44.

The deactivation circuit including diodes 55 and 56 operates as follows. A negative voltage represented by curve 52 is impressed on the anode of diode 55. On the other hand, a positive voltage represented by curve 53 is impressed upon the cathode of diode 56. The AFC signal represented by curve 47 is simultaneously impressed on the cathode of diode 55 and on the anode of diode 56.

When a station has been tuned in properly by tuning control knob 9, diodes 55 and 56 will normally be non-conducting and the AFC circuit will operate normally. The negative voltage impressed on the anode of diode 55 will normally be more negative than the AFC signal impressed on its cathode. For the same reason diode 56 will remain normally non-conducting because its cathode will be more positive than its anode.

Let it now be assumed that tuning control knob 9 is rotated in a sense to increase the intermediate frequency of the receiver. An inspection of Fig. 2 will show that eventually the voltages represented by curves 47 and 53 will be of the same polarity and amplitude. From that point on the positive voltage impressed on the cathode of diode 56 will be less positive than the positive voltage impressed upon its anode. Diode 56 will accordingly conduct current. Since the resistance of resistor 42 is large compared with that of resistor 28, lead 44 will assume the voltage of tap 51. The AFC voltage will accordingly follow dotted line 53 beyond the intersection of curves 53 and 47.

Similarly, when tuning control knob 9 is rotated so as to decrease the intermediate frequency, the voltages represented by curves 47 and 52 will eventually become equal. At the frequency at which this occurs the potential of the anode of diode 55 will be equal to or more positive than its cathode potential, thus permitting the diode to conduct space current. The AFC signal will now follow doted line 52 beyond the intersection of curves 47 and 52. As the mistuning of a receiver is increased, the AFC signal must increase correspondingly to lock in the local oscillator. Consequently, when the AFC signal decreases, the frequency of the local oscillator will shift, and the station previously tuned in is no longer received. This, in turn, will further decrease the AFC signal. Thence, when the detuning of the receiver exceeds a predetermined value, the AFC signal is reduced to an inoperative value and the AFC circuit is effectively deactivated.

It will be understood that the circuit specifications of the automatic tuning control circuit of the invention may vary according to the design for any particular application. Accordingly, the following circuit specifications of the circuit of Fig. 1 are included by way of example only:

| | |
|---|---|
| Load capacitor 25__micromicrofarads__ | 330 |
| Load capacitor 26_____________do____ | 330 |
| Bypass capacitor 31__________do____ | 330 |
| Stabilizing capacitor 30_microfarads__ | 8 |
| Audio bypass capacitor 43_____do____ | 0.1 |
| Resistor 27________________ohms____ | 18,000 |
| Resistor 28__________________do____ | 18,000 |
| Filter resistor 42_____________do____ | 1,000,000 |

Preferably taps 50 and 51 are provided about ⅓ the distance between ground and the terminals of resistor 27, 28 connected to points 33 and 34 respectively. It will be understood that adjustment of taps 50 and 51 on their respective resistors 27, 28 will adjust the automatic tuning range within which the AFC control is effective.

Referring now to Fig. 3 in which like components are designated by the same reference numerals as were used in Fig. 1, there is illustrated a modified tuning control circuit in accordance with the invention which may replace the portion of the circuit of Fig. 1 shown to the right of dotted line 6. The circuit of Fig. 3 is substantially identical with that of Fig. 1 with the exception that the cathode of diode 56 and the anode of diode 55 are connected respectively to the terminals of resistors 28 and 27 which are connected to points 34, 33. As illustrated in Fig. 4, a positive voltage represented by curve 36 is impressed on the cathode of diode 56 and a negative voltage represented by curve 35 of Fig. 4 is impressed on the anode of diode 55. The AFC signal represented by curve 47 is again impressed on the anode of diode 56 and on the cathode of diode 55. With this arrangement diodes 55 and 56 would be normally non-conducting. Furthermore, since curves 35 and 36 do not intersect curves 47, which represents the AFC signal, the automatic tuning range would not be limited. In order to reduce the automatic tuning range of the AFC circuit, a fixed negative voltage source such as battery 61 is provided between the resistor 28 and the cathode of diode 56. This will reduce the voltage represented by curve 36 by a constant predetermined amount as shown at 65. For the same reason, a positive fixed voltage source such as battery 62 is provided between resistor 27 and the anode of diode 55. Consequently, a voltage represented by curve 66 and corresponding to curve 35 reduced by a predetermined amount is impressed on the anode of diode 55.

The circuit of Fig. 3 operates in substantially the same manner as that of Fig. 1. When the detuning of the receiver in either direction exceeds a predetermined amount, the AFC signal is rapidly reduced to an inoperative value as shown by dotted curves 63 and 64 of Fig. 4. It is to be understood that delay voltages such as provided by batteries 61 and 62 may be impressed on diodes 55, 56 in any other conventional manner. The range of effectiveness of the AFC circuit of Fig. 3 is controlled by the voltage of batteries 61, 62 which may be made adjustable.

It is also to be understood that the automatic tuning control circuit of the invention may be used in connection with an AM receiver. In that case, a separate AM detector, shown at 67 in Fig. 3, must be provided which may be coupled to output circuit 10 for demodulating the AM wave. The tuning control circuit of the invention will operate in the manner described herein.

There has thus been described an automatic tuning circuit for an AM or FM receiver where the AFC signal is automatically rendered inoperative when the detuning of the receiver exceeds a predetermined value. The tuning circuit of the invention requires a minimum of extra circuit components and is reliable in operation.

What is claimed is:

1. In a modulated carrier wave receiver of the type comprising an automatic frequency control circuit for developing an automatic frequency control signal of a polarity and magnitude representative of the frequency deviation of the mean frequency of a selected wave from a predetermined frequency of said receiver, the improvement comprising electronic apparatus for deactivating said automatic frequency control circuit and including circuit means for deriving independently of said automatic frequency control signal a deactivation signal of a magnitude representative of said frequency deviation, one of said signals decreasing while the other one of said signals increases when said frequency deviation increases, and means operative in response to predetermined values of said automatic frequency control signal and said deactivation signal for reducing said automatic frequency control signal to an inoperative value.

2. In a modulated carrier wave receiver of the type comprising an automatic frequency control circuit for developing an automatic frequency control signal of a polarity and magnitude representative of the frequency deviation of the mean frequency of a selected wave from a predetermined frequency of said receiver, said automatic frequency control signal being zero when said frequency duration becomes zero, the improvement comprising electronic apparatus for deactivating said automatic frequency control circuit and including circuit means for deriving independently of said automatic frequency control signal a deactivation signal of a magnitude representative of said frequency deviation, said deactivation signal having maximum magnitude when said frequency deviation becomes zero, and means under the joint control of said automatic frequency control signal and said deactivation signal for reducing said automatic frequency control signal to an inoperative value.

3. In a modulated carrier wave receiver of the type comprising an automatic frequency control circuit for developing an automatic frequency control signal of a polarity and magnitude representative of the frequency deviation of the mean frequency of a selected wave from a predetermined frequency of said receiver, the improvement comprising electronic apparatus for deactivating said automatic frequency control circuit and including circuit means for deriving independently of said automatic frequency control signal a deactivation signal consisting of two voltages of opposite polarity and having each a magnitude representative of said frequency deviation, said automatic frequency control signal decreasing and said deactivation voltage increasing in magnitude when said frequency deviation increases, and means operated by said automatic frequency control signal and said deactivation voltage of respective predetermined magnitudes for reducing said automatic frequency control signal to an inoperative value.

4. An automatic tuning circuit for a receiver comprising a signal wave transmission channel tunable over a predetermined frequency range to select a wave within said range, manually operable means for tuning said receiver to select broadly a wave at predetermined frequency; an automatic frequency control circuit including a frequency discriminator coupled to said channel and having an output circuit including means for developing an automatic frequency control signal of a polarity and magnitude representative of the frequency deviation of the mean frequency of said selected wave from the center frequency of said discriminator, a device coupled to said channel and responsive to said automatic frequency control signal for automatically varying the tuning of said receiver to reduce said frequency deviation and electronic apparatus for automatically deactivating said automatic frequency control circuit including a circuit connection to said output circuit for deriving independently of said automatic frequency control signal a deactivation signal of a magnitude representative of said frequency deviation, and apparatus for reducing said automatic frequency control signal to an inoperative value in response to the relative magnitudes of said automatic frequency control signal and of said deactivation signal reaching a predetermined value, thereby to render said automatic frequency control circuit inoperative when said frequency deviation exceeds a predetermined value.

5. An automatic tuning circuit for a receiver comprising a signal wave transmission channel tunable over a predetermined frequency range to select a wave within said range, manually operable means for tuning said receiver to select broadly a wave of predetermined frequency; an automatic frequency control circuit including a frequency discriminator coupled to said channel and having an output circuit including circuit means for developing an automatic frequency control signal representative of the frequency deviation of the mean frequency of said selected wave from the center frequency of said discriminator, a device coupled to said channel and responsive to said automatic frequency control signal for automatically varying the tuning of said receiver to reduce said frequency deviation; and electronic apparatus for automatically deactivating said automatic frequency control circuit including means included in said output circuit for deriving independently of said automatic frequency control signal a deactivation signal of a magnitude dependent upon the extent of said frequency deviation, and apparatus controlled by a combination of said automatic frequency control signal and said deactivation signal in respective predetermined magnitudes for reducing said automatic frequency control signal to an inoperative value.

6. In a signal transmission channel having manually operable tuning means; an automatic frequency control circuit having an output circuit including filter means for developing an automatic frequency control signal which becomes zero when said channel is at resonance with a selected wave, a device responsive to said automatic frequency control signal and coupled to said channel for adjusting the resonance of said channel to a signal wave broadly selected by said tuning means; and electronic means for deactivating said automatic frequency control circuit comprising impedance means included in said output circuit for developing independently of said automatic frequency control signal a deactivation signal having a magnitude dependent upon the resonance of said channel to said selected wave, said magnitude being a maximum when said channel is adjusted to resonance, and means including a rectifier device normally inoperatively biased by said automatic frequency control signal and operatively responsive to said deactivation voltage of predetermined magnitude for reducing said automatic frequency control signal to an inoperative value.

7. An automatic tuning circuit for a receiver comprising a signal wave transmission channel, tunable over a predetermined frequency range to select a wave within said range, manually operable means for tuning said receiver to select broadly a wave of predetermined frequency; an automatic frequency control circuit including a frequency discriminator coupled to said channel, said discriminator having an output circuit coupled thereto and including a filter network for developing an automatic frequency control signal of a polarity and magnitude representative of the frequency deviation of the mean frequency of said selected wave from the assigned center frequency of said discriminator, a device coupled to said channel and responsive to said automatic frequency control signal for automatically varying the tuning of said channel to reduce said frequency deviation; and electronic apparatus for automatically deactivating said automatic frequency control circuit including impedance means in said output circuit for developing independently of said automatic frequency control signal two direct current deactivation voltages of opposite polarity and of a magnitude dependent upon the extent of said frequency deviation, and apparatus responsive to a combination of said automatic frequency control signal and one of said deactivation voltages in like polarity and effective magnitude for reducing said automatic frequency control signal to an inoperative value.

8. An automatic tuning circuit for a superheterodyne receiver comprising a signal wave transmission channel, an oscillator coupled to said channel and tunable over a predetermined frequency range, manually operable means for tuning said channel and oscillator to select broadly a wave of predetermined frequency; an automatic frequency control circuit including a frequency discriminator of the ratio detector type coupled to said channel, said ratio detector having an output circuit for developing two direct current voltages of opposite polarity, each voltage being of a magnitude dependent upon the extent of the frequency deviation of the mean frequency of said selected wave from the assigned center frequency of said ratio detector, a filter circuit coupled to said ratio detector output circuit for developing independently of said developed voltages an automatic frequency control signal of a polarity and magnitude representative of said frequency deviation, a variable impedance device coupled to said oscillator and responsive to said automatic frequency control signal for automatically varying the tuning of said oscillator to reduce said frequency deviation; and electronic apparatus for automatically deactivating said automatic frequency control circuit including rectifier means for comparing the magnitude of said automatic frequency control signal with that of one of said voltages of the same polarity as said control signal and for reducing said automatic frequency control signal to an inoperative value when the magnitude of said signal and of said one of said voltages become substantially equal thereby to deactivate said automatic frequency control circuit when said frequency deviation exceeds a predetermined value.

9. In a signal transmission channel having manually operable tuning means; an automatic frequency control circuit including a ratio detector having an output circuit for developing an automatic frequency control signal which becomes zero when said channel is at resonance with a selected wave, a variable impedance device responsive to said automatic frequency control signal and coupled to said channel for adjusting the resonance of said channel to a signal wave broadly selected by said tuning means; and electronic means for deactivating said automatic frequency control circuit comprising a resistive impedance element included in said ratio detector output circuit for developing independently of said automatic frequency control signal a deactivation signal consisting of two voltages of opposite polarity and having a magnitude dependent upon the resonance of said channel to said selected wave, said magnitude being a maximum when said channel is adjusted to resonance, two rectifiers for comparing the magnitudes of said automatic frequency control circuit and of said deactivation signal and for reducing said automatic frequency control signal to an inoperative value when said magnitudes become substantially equal.

10. In a modulated signal wave receiver having a wave transmission channel, an automatic frequency control circuit comprising a ratio detector including a frequency discriminator network coupled to said channel, a first pair of rectifiers connected in opposed relationship to said discriminator network, an output circuit connected across said rectifiers and including a load capacitor, a pair of resistors and a stabilizing capacitor connected in parallel, the junction point of said pair of resistors being maintained at a fixed potential, a filter circuit coupled to said discriminator network and to said output circuit for developing an automatic frequency control signal, said filter circuit including an impedance element having an impedance larger than that of said pair of resistors, and a second pair of rectifiers connected between said filter network and said pair of resistors, one of said second pair of rectifiers being rendered conducting when the magnitude of said automatic frequency control signal substantially equals the magnitude of one of the voltages derived from said pair of resistors and impressed on said second pair of rectifiers.

11. In a modulated signal wave receiver having a wave transmission channel, an automatic frequency control circuit comprising a ratio detector including a frequency discriminator network coupled to said channel, a first pair of rectifiers connected in opposed relationship to said discriminator network, an output circuit connected across said rectifiers and including a load capacitor, a pair of resistors and a stabilizing capacitor connected in parallel, the junction of said pair of resistors being maintained at a fixed potential, a modulation frequency filter circuit coupled to said discriminator network and to said output circuit for developing an automatic frequency control signal, said filter circuit including an impedance element having an impedance larger than that of said pair of resistors, and a second pair of rectifiers connected in opposed relationship between said filter network and taps on said pair of resistors, one of said second pair of rectifiers being rendered conducting when the magnitude of said automatic frequency control signal substantially equals the magnitude of one of a pair of voltages of the same polarity as said signal, said voltages being derived from said pair of resistors.

12. In a modulated signal wave receiver having a wave transmission channel, an automatic frequency control circuit comprising a ratio detector including a frequency discriminator network coupled to said channel, a first pair of rectifiers connected in opposed relationship to said discriminator network, an output circuit connected across said rectifiers and including a load capacitor, a pair of resistors and stabilizing capacitor connected in parallel, the junction point of said pair of resistors being maintained at a fixed potential, a modulation frequency filter circuit coupled to said discriminator network and to said output circuit for developing an automatic frequency control signal, said filter circuit including a filter resistor having a larger resistance than that of said pair of resistors, a second pair of rectifiers connected in opposed relationship between said filter network and the junction points between said pair of resistors and said first pair of rectifiers, a source of delay voltages provided between said second pair of rectifiers and said junction points, whereby one of said second pair of rectifiers is rendered conducting when the magnitude of said automatic frequency control signal substantially equals the magnitude of one of the voltages of the same polarity as said signal and impressed on said second pair of rectifiers.

13. In a signal transmission channel having manually operable tuning means; an automatic frequency control circuit including a ratio detector, said ratio detector having a frequency discriminator network coupled to said channel, a first pair of rectifiers connected in opposed relationship to said discriminator network, an output circuit connected across said rectifiers and including a load capacitor, a pair of resistors and a stabilizing capacitor connected in parallel, the junction point of said pair of resistors being maintained at a fixed potential, a filter circuit coupled between said discriminator network and said output circuit for developing an automatic frequency control signal, said filter circuit including an impedance element having an impedance larger than that of said pair of resistors, a variable impedance device responsive to said automatic frequency control signal and coupled to said channel for adjusting the resonance of said channel to a signal wave broadly selected by said tuning means, a deactivation signal consisting of two voltages of opposite polarity being developed across said pair of resistors, said deactivation signal having a magnitude dependent upon the resonance of said channel to said selected wave and being a maximum when said channel is adjusted to resonance; and electronic means for deactivating said automatic frequency control circuit including a second pair of rectifiers connected in opposed relationship between said filter network and said pair of resistors, one of said second pair of rectifiers being rendered conducting when the magnitude of said automatic frequency control signal substantially equals the magnitude of one of said voltages of the same polarity as said control signal, thereby to reduce said automatic frequency control signal to an inoperative value.

14. The method of tuning a receiver automatically to a broadly selected signal wave and of limiting the automatic tuning range which comprises developing an automatic frequency control signal representative of the frequency deviation of the mean frequency of said selected wave from an assigned frequency, automatically tuning said receiver to resonance with said selected wave by said automatic frequency control signal, developing independently of said automatic frequency control signal a deactivation signal having a magnitude representative of said frequency deviation, said deactivation signal having a maximum magnitude when said frequency deviation becomes zero, detecting the magnitudes of said automatic frequency control signal and of said deactivation signal respectively representative of a predetermined frequency deviation, and reducing said automatic frequency control signal to an inoperative value in consequence of said detection, thereby to deactivate the automatic frequency control when said frequency deviation exceeds a predetermined value.

15. The method of tuning a superheterodyne receiver automatically to a broadly selected signal wave and of limiting the automatic tuning range which comprises developing an automatic frequency control signal having a polarity and magnitude determined by the frequency deviation of the mean frequency of said selected wave from an assigned frequency, said automatic frequency control signal vanishing when said frequency deviation becomes zero, automatically tuning said receiver to resonance with said selected wave by said automatic frequency control signal, developing independently of said automatic frequency control signal a deactivation signal having a magnitude representative of said frequency deviation, said deactivation signal having a maximum magnitude when said frequency deviation becomes zero, detecting a substantial equality in magnitude of said automatic frequency control signal and said deactivation signal, and reducing said automatic frequency control signal to an inoperative value in response to said detection, thereby to deactivate the automatic frequency control when said frequency deviation exceeds a predetermined value.

16. The method of tuning a superheterodyne receiver automatically to a broadly selected signal wave and of limiting the automatic tuning range which comprises developing an automatic frequency control signal having a polarity and magnitude determined by the frequency deviation of the mean frequency of said selected wave from an assigned frequency, said automatic frequency control signal vanishing when said frequency deviation becomes zero, automatically tuning said receiver to resonance with said selected wave by said automatic frequency control signal, developing independently of said automatic frequency control signal two voltages of opposite polarity having a magnitude representative of said frequency deviation, said voltages having maximum magnitudes when said frequency deviation becomes zero, comparing the magnitudes of said automatic frequency control signal and of said voltages, and reducing said automatic frequency control signal to an inoperative value when said magnitudes become substantially equal, thereby to deactivate the automatic frequency control when said frequency deviation exceeds a predetermined value.

17. The method of tuning a superheterodyne receiver automatically to a broadly selected signal wave and of limiting the automatic tuning range which comprises developing an automatic frequency control signal having a polarity and magnitude determined by the frequency deviation of the mean frequency of said selected wave from an assigned frequency, said automatic frequency control signal vanishing when said frequency deviation becomes zero, automatically tuning said receiver to resonance with said selected wave by said automatic frequency control signal, developing independently of said automatic frequency control signal two deactivation voltages of opposite polarity and equal magnitudes, the magnitudes of said voltages being representative of said frequency deviation, said deactivation voltages having maximum magnitudes when said frequency deviation becomes zero, comparing the magnitude of said automatic frequency control signal with that of one of said deactivation voltages of the same polarity as that said control signal, and reducing said automatic frequency control signal to an inoperative value when, as a result of said comparison the magnitudes of said signal and of said voltage become substantially equal, thereby to deactivate the automatic frequency control when said frequency deviation exceeds a predetermined value.

FRANK MURAL.

REFERENCES CITED

The following references are of record in the file of this patent:

UNITED STATES PATENTS

| Number | Name | Date |
|---|---|---|
| 2,266,065 | Muller | Dec. 16, 1941 |